United States Patent
Lin et al.

(10) Patent No.: US 7,193,314 B2
(45) Date of Patent: *Mar. 20, 2007

(54) SEMICONDUCTOR DEVICES AND SUBSTRATES USED IN THEREOF

(75) Inventors: Wei Feng Lin, Hsinchu (TW); Chung Ju Wu, Kaohsiung (TW); Wen-Yu Lo, Taichung (TW); Wen-Dong Yen, Tainan (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 422 days.

This patent is subject to a terminal disclaimer.

(21) Appl. No.: 10/341,339

(22) Filed: Jan. 14, 2003

(65) Prior Publication Data
US 2004/0135249 A1 Jul. 15, 2004

(51) Int. Cl.
*H01L 23/485* (2006.01)
*H01L 23/48* (2006.01)

(52) U.S. Cl. ............... 257/700; 257/698; 257/E23.011; 257/E23.019

(58) Field of Classification Search ........ 257/690–700, 257/734, 737, 738, 668; 174/250–268
See application file for complete search history.

(56) References Cited
U.S. PATENT DOCUMENTS 5,841,192 A * 11/1998 Exposito ............... 257/701
5,883,427 A * 3/1999 Arimoto ............... 257/690
6,285,079 B1 * 9/2001 Kunikiyo ............... 257/737
6,506,671 B1 * 1/2003 Grigg ............... 438/612
6,528,734 B2 * 3/2003 Mizunashi ............... 174/255
6,753,595 B1 * 6/2004 Lin et al. ............... 257/668

FOREIGN PATENT DOCUMENTS
JP 2002-299512 A 10/2002

* cited by examiner

*Primary Examiner*—Marcos D. Pizarro
(74) *Attorney, Agent, or Firm*—Birch, Stewart, Kolasch and Birch, LLP

(57) ABSTRACT

A substrate used in a semiconductor device. The substrate includes a first wiring layer, a second wiring layer, and an interconnection-wiring layer. The first wiring layer includes a plurality of first pads, and the second wiring layer includes a plurality of second pads. The interconnection-wiring layer is set between the first and second wiring layer. In this case, at least one of the second pads that does not electrically connect to anyone of the first pads electrically connects to the interconnection-wiring layer. In another case, a shielding portion, which electrically connects the interconnection-wiring layer, is provided around the second pad that doesn't electrically connect to anyone of the first pads. Furthermore, this invention also discloses a semiconductor device including the substrate.

19 Claims, 5 Drawing Sheets

SEMICONDUCTOR DEVICES AND SUBSTRATES USED IN THEREOF

BACKGROUND OF THE INVENTION

1. Field of the Invention

The invention relates to a semiconductor device and a substrate used in thereof and, in particular, to a semiconductor device and a substrate used in thereof having an electrostatic discharge protection function.

2. Related Art

Due to the high integrity and the needs of the consuming market, the sizes of semiconductor devices have become more compact. Therefore, many semiconductor package technologies have been developed, such as PGA (Pin Grid Array), BGA (Ball Grid Array), and wafer level packaging.

Among the aforementioned package technologies, the substrate 11 of a BGA semiconductor device 1 (as shown in FIG. 1) is used more efficiently to have more bumps 13. The bumps 13 electrically connect to the pads of the die chip 12 via the trace lines and pads on the substrate 11. Since the number of the bumps is larger, the die chip 12 can transmits larger amount of signals via the bumps 13.

Please refer to FIG. 2, the above-mentioned substrate 11 includes a first wiring layer 21, a ground interconnection-wiring layer 22, a power interconnection-wiring layer 23, and a second wiring layer 24. These four layers are stacked in sequence to form the substrate 11. The top surface of the first wiring layer 21 is provided with a plurality of first pads 211 for electrically connecting to the pads of the die chip 12. Furthermore, a plurality of first trace lines 212 are formed in the first wiring layer 21. One end of each of the first trace lines 212 connects to a corresponding first pads 211.

The ground interconnection-wiring layer 22 and the power interconnection-wiring layer 23 connect to specific pads in the first wiring layer 21 (a ground ring) and specific pads of the second wiring layer 24 (a power ring), respectively, to provide a ground voltage level and a power voltage level to the die chip 12 from an external circuit.

The bottom surface of the second wiring layer 24 is provided with a plurality of second pads 241, each of which is formed with a bump 13. Moreover, a plurality of second trace lines 242 are formed in the second wiring layer 24, one end of each of the second trace lines 242 connects to a corresponding second pads 241. Another end of each of the first trace lines 212 connects another end of each of the second trace lines 242 via a via hole (not shown in the drawing). The pads of the die chip 12 communicate with external circuits through the first pads 211, the first trace lines 212, the via holes, the second trace lines 242, the second pads 241, and the bumps 13.

From the above, since the number of second pads 241 provided by the substrate 11 to connect with the bumps 13 usually exceeds the number of the pads of the die chip 12, some of the bumps 13 are not electrically connected with pads of the die chip 12. These bumps 13 are called NC Balls. More specifically, the second pads connected with the NC Balls do not connect with the second trace lines, thus the NC Balls do not electrically connected with the pads of the die chip 12. The reason to reserve these NC Balls is to provide input/output terminals required when the function of the semiconductor device (such as the BGA semiconductor device 1 mentioned above) is improved. However, when the above-mentioned BGA semiconductor device 1 is under operation, the NC Balls are in a floating status. Under this situation, if an ESD (electrostatic discharge) test is performed to these NC Balls, the electrostatic charges may move into the die chip to damage other functional pins. If this happens, the functions of the BGA semiconductor device will become abnormal.

Therefore, how to provide a semiconductor device with a superior ESD protection capability has become an important issue to be solved.

SUMMARY OF THE INVENTION

In view of the above, an objective of the invention is to provide a semiconductor device and a substrate used in thereof with a superior ESD protection capability.

To achieve the above-mentioned objective, the substrate according to the invention includes a first wiring layer, a second wiring layer, and an interconnection-wiring layer. The top surface of the first wiring layer is provided with a plurality of first pads. The bottom surface of the second wiring layer is provided with a plurality of second pads. The interconnection-wiring layer is provided between the bottom surface of the first wiring layer and the top surface of the second wiring layer, and at least one of the second pads is electrically connected with the interconnection-wiring layer and is not electrically connected with any of the first pads.

Furthermore, the invention also provides a substrate including a first wiring layer, a second wiring layer, and an interconnection-wiring layer. The top surface of the first wiring layer is provided with a plurality of first pads. The bottom surface of the second wiring layer is provided with a plurality of second pads and at least one shielding portion. At least one of the second pads is not electrically connected with any of the first pads, and the shielding portion is provided around this second pad. The interconnection-wiring layer is provided between the bottom surface of the first wiring layer and the top surface of the second wiring layer. The shielding portion is electrically connected with the interconnection-wiring layer.

The invention further provides a semiconductor device, which includes the substrate mentioned above and a die chip. The die chip is provided on the first wiring layer of the substrate, and the pads of the die chip are electrically connected with the first pads, respectively.

Since the substrate and the semiconductor device according to the embodiments of the invention provide ground level or power level to the shielding portions or the second pads not connecting to any of the first pads (the NC Balls), the flow of electrostatic charges of the second pads not connecting to any of the first pads to neighboring second pads can be prevented. Therefore, the electrostatic discharge protection capability of a semiconductor device could be improved significantly.

BRIEF DESCRIPTION OF THE DRAWINGS

The invention will become more fully understood from the detailed description given herein below illustration only, and thus are not limitative of the present invention, and wherein.

DETAILED DESCRIPTION OF THE PREFERRED EMBODIMENTS

The semiconductor device and the substrate used in thereof according to the preferred embodiment of the invention will be described hereinbelow with reference to the accompany drawings, wherein the same reference numbers refer to the same elements.

Figure 1:
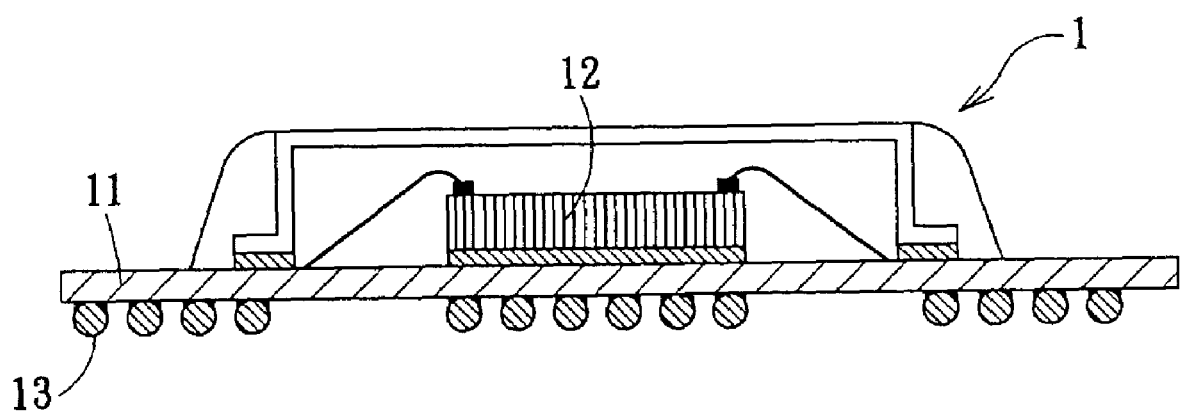
FIG. 1 is a schematic diagram showing a BGA-type semiconductor device in the prior art.
Figure 2:
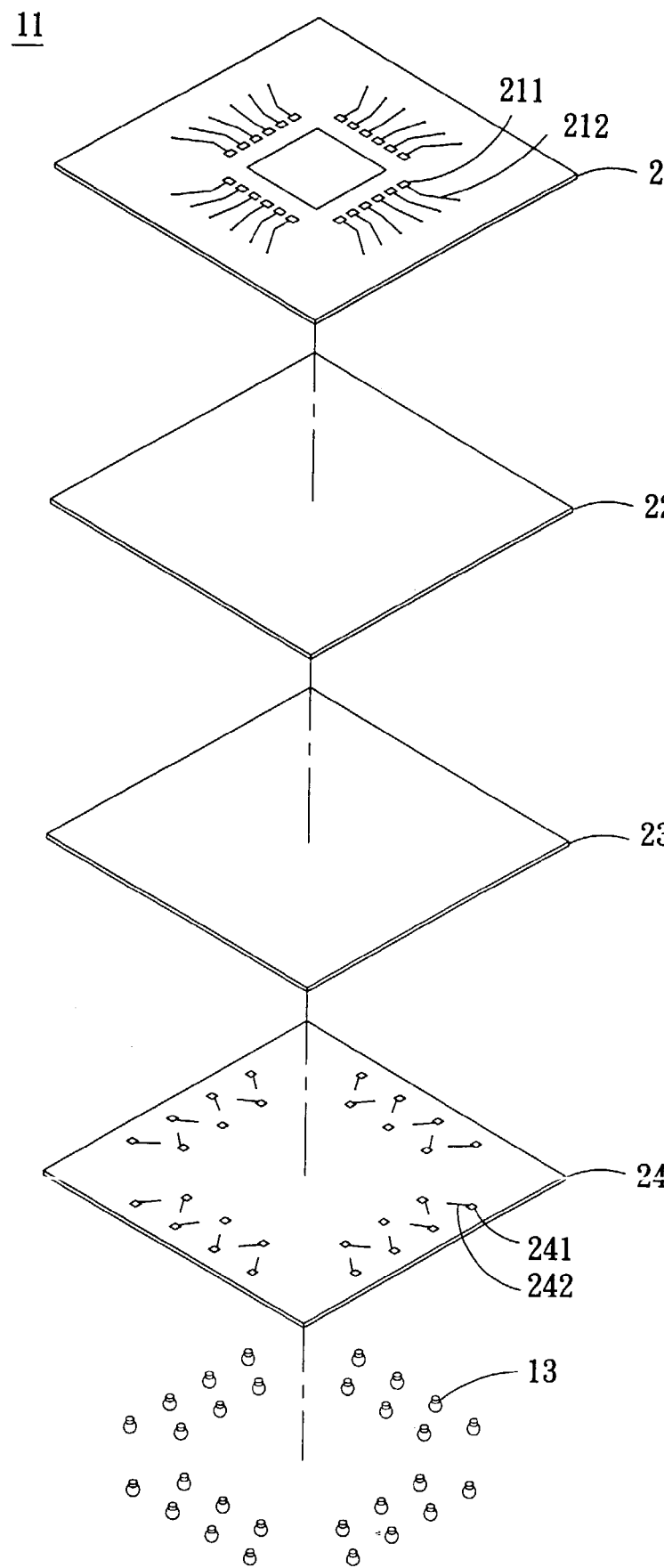
FIG. 2 is a schematic diagram showing the substrate of the BGA-type semiconductor device shown in FIG. 1.
Figure 3:
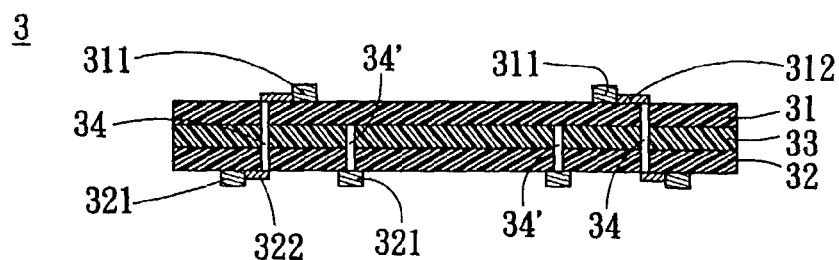
FIG. 3 is a schematic diagram showing a substrate according to an embodiment of the invention.

Please refer to FIG. 3. The substance 3 according to a preferred embodiment of the invention includes a first wiring layer 31, a second wiring layer 32 and an interconnection-wiring layer 33.

The top surface of the first wiring layer 31 is provided with a plurality of first pads 311, with electrically connect to the pads of a die chip (not shown in the drawing). Moreover, a plurality of first trace lines 312 are formed in the first wiring layer 31. One end of each of the first trace lines 312 connects to a corresponding first pad 311, and another end of each of the first trace lines 312 connects to a via hole 34.

The bottom surface of the second wiring layer 32 is provided with a plurality of second pads 321, and bumps are formed on the second pads 321. Furthermore, a plurality of second trace lines 322 are formed in the second wiring layer 32. One end of each of the second trace lines 322 connects to a corresponding second pad 321, and another end of each of the second trace lines 322 electrically connects to another end of a corresponding first trace line 312 through the via hole 34. In the present embodiment, at least one second pad 321 is not electrically connected with any of the first pads 311. Furthermore, the second pads 321 are arranged in an array, and the substrate 3 is a BGA (Ball Grid Array) substrate.

The interconnection-wiring layer 33 is between the bottom surface of the first wiring layer 31 and the top surface of the second wiring layer 32. In the present embodiment, the second pad 321 not connecting to any of the first pads 311 electrically connects to the interconnection-wiring layer 33 via a via hole 34'. The interconnection-wiring layer 33 may electrically connect to a ground to provide a ground voltage level to the second pads 321. Alternatively, the interconnection-wiring layer 33 may electrically connect to a power source to provide a power voltage level to the second pads 321. It should be noted that the substrate 3 might have more than one interconnection-wiring layer. For example, the substrate 3 may have two interconnection-wiring layers: one connects to the power source while another connects to a ground.

It should be also noted that an isolation layer may be provided between the wiring layers to ensure the electric insulation between each wiring layers, and the only openings on the isolation layer are via holes 34 and 34' to electrically connect the first trace line 312 and the second trace line 322, and to electrically connect the second pads 321 and the interconnection-wiring layer 33 not electrically connecting to the first pads 311.

Figure 4:
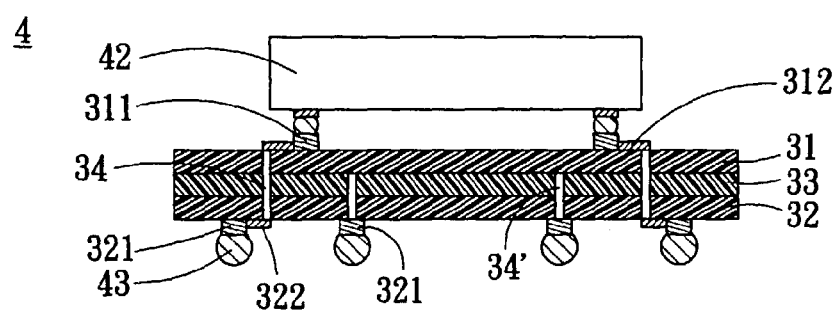
FIG. 4 is a schematic diagram showing a semiconductor device according to another embodiment of the invention having the substrate shown in FIG. 3.

Please refer to FIG. 4, the semiconductor device 4 according to another preferred embodiment of the invention includes the substrate 3 and a die chip 42.

In the present embodiment, the substrate 3 is provided with a plurality of bumps 43, each of which connects to a corresponding second pad 321. The die chip 42 is glued on the first wiring layer 31 of the substrate 3, and the pads of the die chip are electrically connected to the first pads 311.

Figure 5:
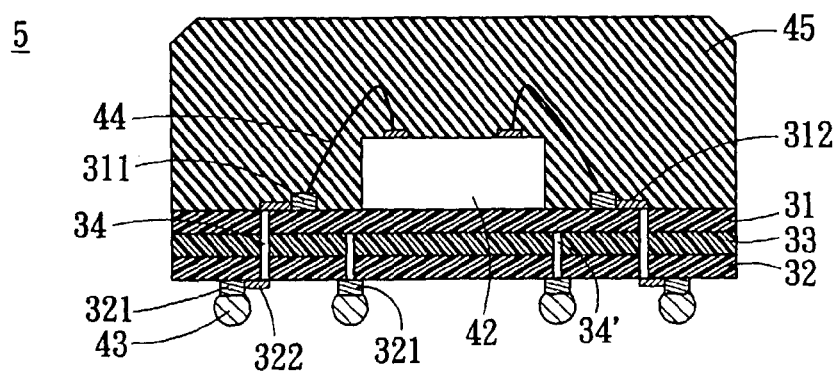
FIG. 5 is a schematic diagram showing a semiconductor device according to still another embodiment of the invention having the substrate shown in FIG. 3.

It should be noted that in the present embodiment, the die chip 42 is provided on the substrate by flip-chip technology. That is, the pads of the die chip 42 connect to the first pads 311 via the bumps. The die chip 42 may also be provided on the substrate 3 by wire-bonding. As shown in FIG. 5, in the semiconductor device 5 according to another embodiment of the invention, the die chip 42 electrically connects to the first pads via a plurality of bonding wires 44. To protect the die chip 42 and the bonding wires 44, an epoxy molding 45 is provided to encapsulate the die chip 42 and the bonding wires 44.

Figure 6:
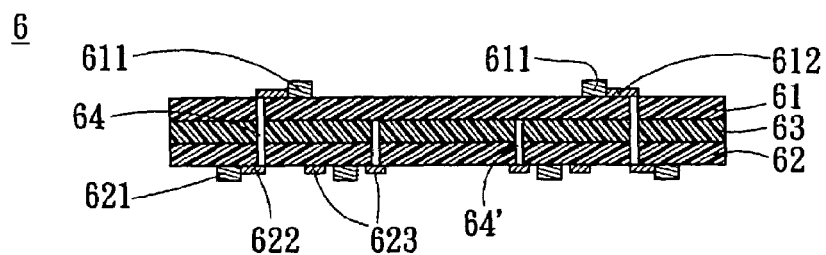
FIG. 6 is a schematic diagram showing a substrate according to still another embodiment of the invention.

Please refer to FIG. 6. The substrate 6 according to another embodiment of the invention includes a first wiring layer 61, a second wiring layer 62, and an interconnection-wiring layer 63.

The top surface of the first wiring layer 61 is provided with a plurality of first pads 611 and a plurality of first trace lines 612. The first pads 611 electrically connect to the pads of a die chip (not shown in the drawings). One end of each of the first trace lines 612 connects to a corresponding first pad 611, and another end of each of the first trace lines 612 connects to a via hole 64.

Figure 7A:
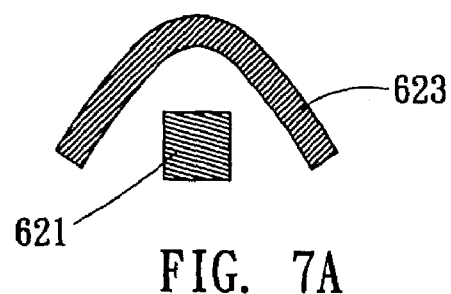
FIG. 7A to FIG. 7C are schematic diagrams showing various types of shielding portions.
Figure 7B:
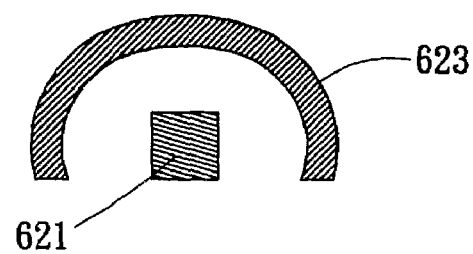
Figure 7C:
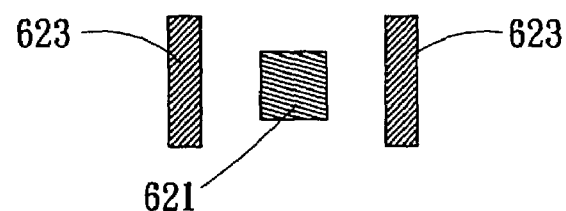

The bottom surface of the second wiring layer 62 is provided with a plurality of second pads 621, a plurality of second trace lines 622, and at least one shielding portion 623. In the present embodiment, bumps are formed on the second pads 621. One end of each of the second trace lines 622 connects to a corresponding second pad 621, and another end of each of the second trace lines 622 electrically connects to another end of the corresponding first trace line 612 via the via hole 64. At least one second pad 621 is not electrically connect to any of the first pads 611, and the shielding portion 623 is provided around the second pad 621 not electrically connecting to any of the first pads 611. Furthermore, the second pads 621 are arranged in an array, and the substrate 6 is a BGA substrate. Moreover, the shielding portion may be provided around the second pad 621 not electrically connecting to any of the first pads 611 in various ways, such as the ways shown in FIG. 7A to FIG. 7C.

The interconnection-wiring layer 63 is provided between the bottom surface 61 of the first wiring layer 61 and the top surface of the second wiring layer 62. In the present embodiment, the shielding portion 623 electrically connect to the interconnection-wiring layer 63 via the via hole 64'. Under this situation, the interconnection-wiring layer 63 may electrically connect to a ground to provide a ground voltage level to the shielding portion 623. The interconnection-wiring layer 63 may alternatively electrically connect to a power source to provide a power voltage level to the shielding portion 623. It should be noted that the substrate 6 might have more than one interconnection-wiring layer. For example, the substrate 6 may have two interconnection-wiring layers: one connects to the power source while another connects to a ground.

To ensure the electric insulation between each wiring layer, an isolation layer may be provided between the wiring layers as mentioned previously. The corresponding descriptions are omitted here for concise purpose.

Figure 8A:
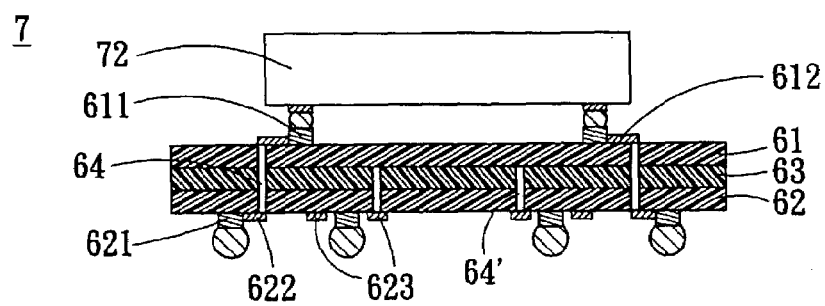
FIG. 8A is a schematic diagram showing a semiconductor device according to still another embodiment of the invention having the substrate shown in FIG. 6.
Figure 8B:
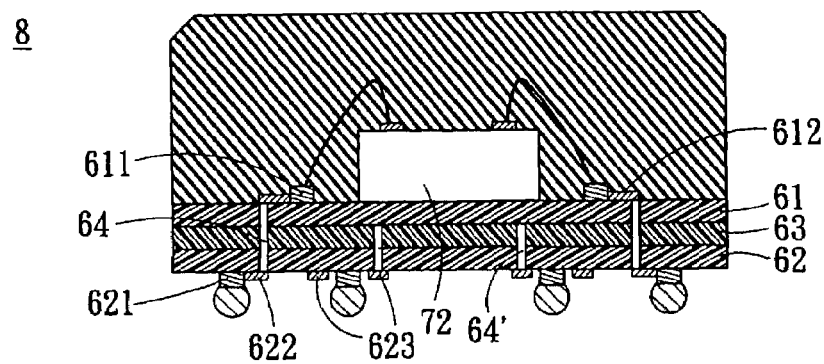
FIG. 8B is a schematic diagram showing a semiconductor device according to still another embodiment of the invention having the substrate shown in FIG. 6.

Please refer to FIG. 8A and FIG. 8B. In semiconductor devices 7 and 8 according to another embodiments of the invention, the die chip 72 is loaded by the substrate 6 mentioned above. In the semiconductor device 7, the die chip 72 is provided using flip-chip technology. In the semiconductor device 8, the die chip 72 is provided by wire bonding.

To sum up, the substrate and the semiconductor device according to the embodiments of the invention can prevent the electrostatic charges of the second pads not connecting to any of the first pads from flowing to neighboring second pads. This is accomplished by providing ground level or power level to the shielding portions or the second pads not connecting to any of the first pads. Therefore, the electrostatic discharge protection capability of a semiconductor device could be improved significantly.

While the invention has been described with reference to a preferred embodiment, this description is not intended to be construed in a limiting sense. Various modifications of the embodiment will be apparent to persons skilled in the art upon reference to the description. It is therefore intended that the appended claims encompass any such modifications.

What is claimed is:

1. A substrate, comprising:
    a first wiring layer, the top surface of which is provided with a plurality of first pads;
    a second wiring layer, the bottom surface of which is provided with a plurality of second pads; and
    an interconnection-wiring layer provided between the bottom surface of the first wiring layer and the top surface of the second wiring layer, wherein at least one of the second pads is electrically connected with the interconnection-wiring layer and is not electrically connected with any of the first pads.

2. The substrate according to claim 1, wherein the second pads are arranged in an array.

3. The substrate according to claim 1, wherein the second pad not electrically connected with any of the first pads is electrically connected with a ground via the interconnection-wiring layer.

4. The substrate according to claim 1, wherein the second pad not electrically connected with any of the first pads is electrically connected with a power source via the interconnection-wiring layer.

5. The substrate according to claim 1, wherein a plurality of bumps are provided on the second pads, and the first pads are electrically connected with pads of a die chip.

6. The substrate according to claim 1, further comprising:
    a plurality of isolation layers provided between the first wiring layer and the interconnection-wiring layer, and between the interconnection-wiring layer and the second layer.

7. A semiconductor device, comprising:
    a substrate, which includes a first wiring layer, the top surface of which is provided with a plurality of first pads;
    a second wiring layer, the bottom surface of which is provided with a plurality of second pads; and
    an interconnection-wiring layer provided between the bottom surface of the first wiring layer and the top surface of the second wiring layer, wherein at least one of the second pads is electrically connected with the interconnection-wiring layer and is not electrically connected with any of the first pads; and
    a die chip provided on the first wiring layer of the substrate, pads of the die chip being electrically connected with the first pads.

8. The semiconductor device according to claim 7, wherein the second pads are arranged in an array, and a plurality of bumps are provided on the second pads.

9. The semiconductor device according to claim 7, wherein the second pad not electrically connected with any of the first pads is electrically connected with a ground via the interconnection-wiring layer.

10. The semiconductor device according to claim 7, wherein the second pad not electrically connected with any of the first pads is electrically connected with a power source via the interconnection-wiring layer.

11. The semiconductor device according to claim 7, wherein the die chip is provided on the substrate by flip-chip technology.

12. The semiconductor device according to claim 7, wherein the die chip is provided on the substrate by wire bonding, and the semiconductor device further comprises:
    a plurality of bonding wires connecting the pads of the die chip and the first pads, and an epoxy molding encapsulating the die chip and the bonding wires.

13. The semiconductor device according to claim 7, wherein the substrate further comprises:
    a plurality of isolation layers provided between the first wiring layer and the interconnection-wiring layer, and between the interconnection-wiring layer and the second layer.

14. A substrate, comprising:
    a first wiring layer, the top surface of which is provided with a plurality of first pads;
    a second wiring layer, the bottom surface of which is provided with a plurality of second pads and at least one electrical shielding portion, wherein at least one of the second pads is not electrically connected with any of the first pads, and the electrical shielding portion is provided around the second pad not electrically connected with any of the first pads; and
    an interconnection-wiring layer provided between the bottom surface of the first wiring layer and the top surface of the second wiring layer, wherein the shielding portion is electrically connected with the interconnection-wiring layer.

15. The substrate according to claim 14, wherein the second pads are arranged in an array.

16. The substrate according to claim 14, wherein the second pad not electrically connected with any of the first pads is electrically connected with a ground via the interconnection-wiring layer.

17. The substrate according to claim 14, wherein the second pad not electrically connected with any of the first pads is electrically connected with a power source via the interconnection-wiring layer.

18. The substrate according to claim 14, wherein a plurality of bumps are provided on the second pads, and the first pads are electrically connected with pads of a die chip.

19. The substrate according to claim 14, further comprising:
    a plurality of isolation layers provided between the first wiring layer and the interconnection-wiring layer, and between the interconnection-wiring layer and the second layer.

* * * * *